United States Patent [19]
Fujimoto et al.

[11] Patent Number: 6,083,853
[45] Date of Patent: Jul. 4, 2000

[54] FORMED SHEET OF THERMOCONDUCTIVE SILICONE GEL AND METHOD FOR PRODUCING THE SAME

[75] Inventors: Mitsuhiro Fujimoto, Aichi; Yoshimitsu Maeda, Gifu; Kenichi Suzuki, Aichi, all of Japan

[73] Assignee: Fuji Polymer Industries Co., Ltd., Aichi, Japan

[21] Appl. No.: 08/961,535

[22] Filed: Oct. 30, 1997

[30] Foreign Application Priority Data

Nov. 6, 1996 [JP] Japan .................................... 8-294138

[51] Int. Cl.[7] .......................... B29C 43/28; B32B 25/02
[52] U.S. Cl. ...................................... 442/1; 442/2; 442/37
[58] Field of Search ............................... 442/59, 61, 157, 442/1, 2, 37

[56] References Cited

FOREIGN PATENT DOCUMENTS

| | | |
|---|---|---|
| 58-218710 | 12/1983 | Japan . |
| 58-218712 | 12/1983 | Japan . |
| 58-218713 | 12/1983 | Japan . |
| 59-136954 | 8/1984 | Japan . |
| 2-166755 | 6/1990 | Japan . |
| 2-196453 | 8/1990 | Japan . |
| 6-155517 | 6/1994 | Japan . |
| 7-266356 | 10/1995 | Japan . |

*Primary Examiner*—Richard Weisberger
*Attorney, Agent, or Firm*—Merchant & Gould P.C.

[57] ABSTRACT

A formed sheet of thermalconductive silicone gel is provided. The formed sheet has (i) a thin film reinforcement layer hardened into rubber only in a surface layer on the upper side, the lower side, or both sides, (ii) a sheet-shaped reinforcement material buried in a surface layer of the upper or the lower side, or (iii) a sheet-shaped reinforcement material buried in a surface layer of the upper side or the lower side of the sheet, and a thin film reinforcement layer hardened into rubber in this surface layer or in a surface layer on both sides of the sheet. The formed sheet of thermalconductive silicone gel has low compressibility, high strength, is easy to handle during the mounting process, and can be reused after its contact compression between a chip and a heat sink has been released.

10 Claims, 3 Drawing Sheets

FORMED SHEET OF THERMOCONDUCTIVE SILICONE GEL AND METHOD FOR PRODUCING THE SAME

FIELD OF THE INVENTION

The present invention relates to a thermalconductive sheet that is used as a member of a heat dissipation and cooling structure for heat generating electronic parts and the like, especially to a thermalconductive sheet with low rigidity that is used for dissipating heat and cooling of heat generating electronic parts and the like.

BACKGROUND OF THE INVENTION

In the past, the following types of thermalconductive sheets with low rigidity have been proposed as a member of a heat dissipation and cooling structure for heat generating electronic parts and the like:

(1) A thermalconductive sheet that is not deformed or damaged by the compression of a heat generating electronic member (referred to below as "chip") and a heat sink, because the compression load on the sheet is held low when the sheet is compressed to establish a tight contact (referred to below as "contact compression") between the chip and the heat sink.

(2) A thermalconductive sheet that is tightly contacted when being contact-compressed between a chip and a heat sink having an uneven surface on the contact side, because the thermalconductive sheet is elastic, thus ensuring a sufficiently large thermalconductive surface.

(3) A thermalconductive sheet that (a) has sufficiently tight contact with all of a plurality of chips mounted on a board, and (b) that is not deformed or damaged by the compression of the chips and a heat sink when being contact-compressed between the plurality of chips and the heat sink, because the thermalconductive sheet is elastic.

A silicone gel sheet containing a thermalconductive filler, and Japanese Tokkai No. Hei 6-166755, No. Hei 2-196453, and No. Hei 2-155517 are known as examples for such thermalconductive sheets.

However, a silicone gel sheet containing a thermalconductive filler, and a thermalconductive silicone gel sheet having grooves on one or both sides (Tokkai Hei 2-166755), are extremely soft and lack strength, and therefore pose severe problems regarding the handling of the sheets during the mounting process. Furthermore, because both sides of the sheet have roughly the same degree of stickiness, the sheet may stick to both the chip and the heat sink when releasing the contact compression between the chip and the heat sink for maintenance after the mounting, resulting in extreme deformation or even rupture, and thus making reuse of the sheet impossible.

A compound thermalconductive sheet, wherein a silicone gel containing a thermalconductive filler is layered and hardened on a silicone rubber sheet containing a thermalconductive filler (Tokkai Hei 2-196453), and a thermalconductive compound sheet, wherein a low rigidity silicone rubber containing a thermalconductive filler is integrated with a sheet made by coating a meshed reinforcement material with a silicone rubber containing a thermalconductive filler and then hardened (Tokkai Hei 2-196453), are both soft in a direction perpendicular to the sheet, rigid in the in-plane direction and sticky only on one side and therefore easy to handle during the mounting process and can be reused after release of the contact compression. However, because the compressibility of such sheets is about 2 to 5 times higher than the compressibility of a single thermal-conductive silicone gel sheet, these sheets cannot be used when the mounting electronic parts such as chips, heat sinks, and boards having low rigidity, or when the height difference of a plurality of chips mounted on a board is large.

SUMMARY OF THE INVENTION

It is the purpose of the present invention to overcome the problems of the prior art by providing a formed sheet of thermalconductive silicone gel that has a low compressibility and a high rigidity, that is easy to handle during the mounting process, and that can be reused after the release of the contact compression with a chip and a heat sink.

A first formed sheet of thermalconductive silicone gel according to the present invention is characterized in that a thin film reinforcement layer is hardened into rubber in a surface layer on at least one side of the sheet.

In the first formed sheet of thermalconductive silicone gel according to the present invention it is preferable that a silicone gel containing a thermalconductive filler is sandwiched between (a) a resin film to which has been applied an organohydrogen polysiloxane containing at least two hydrogen atoms bonded to a silicon atom in each molecule and (b) a resin film to which said organohydrogen polysiloxane has not been applied, or sandwiched between two resin films to which said organohydrogen polysiloxane has been applied; rolled by being continually passed through at least one pair of rolls; continually passed through a heating furnace; and hardened; in order to form a thin film reinforcement layer hardened into rubber on at least one side of the sheet.

A second formed sheet of thermalconductive silicone gel according to the present invention is characterized in that a thin film reinforcement layer is hardened into rubber in a surface layer on at least one side of the sheet, and a sheet-shaped reinforcement material is buried in a surface layer on one side of the sheet.

In the second formed sheet of thermalconductive silicone gel according to the present invention, it is preferable that a silicone gel containing a thermalconductive filler is sandwiched between (a) a resin film having a surface to which has been applied an organohydrogen polysiloxane containing at least two hydrogen atoms bonded to a silicon atom in each molecule, and onto which surface a sheet-shaped reinforcement layer has been layered and (b) a resin film to which said organohydrogen polysiloxane has not been applied, or between two resin films to which said organohydrogen polysiloxane has been applied; rolled by being continually passed through at least one pair of rolls; continually passed through a heating furnace; and hardened; in order to form a sheet-shaped reinforcement material buried in a surface layer on one side of the sheet and a thin film reinforcement layer hardened into rubber on at least one side of the sheet.

In the first and second formed sheet of thermalconductive silicone gel according to the present invention, it is preferable that the hardness of the thin film reinforcement layer is in the range of 10–95 when measured with an ASKER F hardness meter. It is even more preferable that the hardness of the thin film reinforcement layer is in the range of 20–70 when measured with an ASKER F hardness meter.

In the first and second formed sheet of thermalconductive silicone gel according to the present invention, it is preferable that the thickness of the thin film reinforcement layer is in the range of 0.01–0.5 mm. It is even more preferable that the thickness of the thin film reinforcement layer is in the range of 0.01–0.1 mm.

A third formed sheet of thermalconductive silicone gel according to the present invention is characterized in that a sheet-shaped reinforcement material is buried in a surface layer on one side of a formed sheet of silicon gel containing a thermalconductive filler.

In the third formed sheet of thermalconductive silicone gel according to the present invention, it is preferable that a silicone gel containing a thermalconductive filler is sandwiched between (a) a resin film onto whose surface a sheet-shaped reinforcement layer has been layered and (b) a resin film onto whose surface a sheet-shaped reinforcement layer has not been layered; rolled by being continually passed through at least one pair of rolls; continually passed through a heating furnace; and hardened; in order to form to form a sheet-shaped reinforcement material buried in a surface layer on one side of the sheet.

In the second and third formed sheet of thermalconductive silicone gel according to the present invention, it is preferable that the depth to which the sheet-shaped reinforcement material is buried in a surface layer on one side of the sheet is in the range of more than 0 mm but not more than 1 mm. Here, the term "depth" indicates the distance from the upper surface of the reinforcement material to the upper surface of the gel. It is even more preferable that the depth to which the sheet-shaped reinforcement material is buried in a surface layer on one side of the sheet is in the range of more than 0 mm but not more than 0.5 mm.

In the second and third formed sheet of thermalconductive silicone gel according to the present invention, it is preferable that the sheet-shaped reinforcement material buried in a surface layer on one side of the sheet has a mesh fabric structure using at least one fiber selected from synthetic fiber and natural fiber.

A first method of manufacturing a formed sheet of thermalconductive silicone gel according to the present invention comprises the steps of: sandwiching a silicone gel containing a thermalconductive filler between (a) a resin film to which has been applied an organohydrogen polysiloxane containing at least two hydrogen atoms bonded to a silicon atom in each molecule and (b) a resin film to which said organohydrogen polysiloxane has not been applied, or sandwiching said silicone gel between two resin films to which said organohydrogen polysiloxane has been applied; rolling the silicone gel by continually passing the silicone gel through at least one pair of rolls; and hardening the silicone gel by continually passing the silicone gel through a heating furnace.

A second method of manufacturing a formed sheet of thermalconductive silicone gel according to the present invention comprises the steps of: sandwiching a silicone gel containing a thermalconductive filler between (a) a resin film having a surface to which has been applied an organohydrogen polysiloxane containing at least two hydrogen atoms bonded to a silicon atom in each molecule, and onto which surface a sheet-shaped reinforcement layer has been layered and (b) a resin film to which said organohydrogen polysiloxane has not been applied, or sandwiching the silicone gel between two resin films to which said organohydrogen polysiloxane has been applied; rolling the silicone gel by being continually passing it through at least one pair of rolls; and hardening the silicone gel by continually passing the silicone gel through a heating furnace.

A third method of manufacturing a formed sheet of thermalconductive silicone gel according to the present invention comprises the steps of: sandwiching a silicone gel containing a thermalconductive filler between (a) a resin film onto whose surface a sheet-shaped reinforcement layer has been layered and (b) a resin film onto whose surface a sheet-shaped reinforcement layer has not been layered; rolling the silicone gel by being continually passed through at least one pair of rolls; and hardening the silicone gel by continually passing the silicone gel through a heating furnace.

DETAILED DESCRIPTION OF THE INVENTION

To obtain a formed sheet of thermalconductive silicone gel, one of the following five procedures can be used when forming the silicone gel containing a thermalconductive filler. The resulting formed sheet of thermalconductive silicone gel has low compressibility, high strength, is easy to handle during the mounting process, and can be reused after the contact compression between the chip and the heat sink has been released.

Procedure 1

The not yet hardened silicone gel containing a thermalconductive filler is placed onto a resin film, and an organohydrogen polysiloxane containing at least two hydrogen atoms bonded to a silicon atom in each molecule is applied from above the silicone gel to its surface.

Another resin film is placed on top of the silicone gel, which is then shaped into sheet form and hardened between the two resin films. The result is a formed sheet of thermalconductive silicone gel having a thin film reinforcement layer hardened into rubber only in a surface layer to which the organohydrogen polysiloxane was applied. Preferable formation methods for this procedure are press forming, coating forming and calender forming.

In addition, a formed sheet of thermalconductive silicone gel having a thin film reinforcement layer hardened into rubber only in said surface layer was produced by the following method using roll forming: A silicone gel containing a thermalconductive filler was sandwiched between (a) a resin film to which has been applied an organohydrogen polysiloxane containing at least two hydrogen atoms bonded to a silicon atom in each molecule and (b) a resin film to which said organohydrogen polysiloxane has not been applied, and was then rolled by being continually passed through at least one pair of rolls.

When the rolled sheet is continually passed through a heating furnace and hardened, then the silicone gel containing a thermalconductive filler becomes a formed sheet of thermalconductive silicone gel having a thin film reinforcement layer hardened into rubber only in the surface layer to which said organohydrogen polysiloxane has been applied.

Procedure 2

A silicone gel containing a thermalconductive filler is placed between two resin films, to whose surface an organohydrogen polysiloxane containing at least two hydrogen atoms bonded to a silicon atom in each molecule has been applied. The silicone gel is then shaped into sheet form and hardened. The result is a formed sheet of thermalconductive silicone gel having a thin film reinforcement layer hardened into rubber only in a surface layer on the upper and lower sides of the sheet. Preferable formation methods for this procedure are press forming, coating forming and calender forming.

Furthermore, a formed sheet of thermalconductive silicone gel having a thin film reinforcement layer hardened into rubber only in said surface layer was produced by the following method using roll forming: A silicone gel containing a thermalconductive filler was sandwiched between two resin films to which has been applied an organohydrogen polysiloxane containing at least two hydrogen atoms bonded to a silicon atom in each molecule, and was then rolled by being passed through at least one pair of rolls.

When the rolled sheet is continually passed through a heating furnace and hardened, then the silicone gel containing a thermalconductive filler becomes a formed sheet of thermalconductive silicone gel having a thin film reinforcement layer hardened into rubber only on the upper and lower surface layers.

Procedure 3

A not yet hardened silicone gel containing a thermalconductive filler is placed onto a resin film, a sheet-shaped reinforcement material and another resin film are placed on top of the silicone gel, and the silicone gel is shaped into sheet form and hardened. The silicone gel containing a thermalconductive filler, which silicone gel is hardened between the two resin films becomes a formed sheet of thermalconductive silicone gel having a sheet-formed reinforcement material buried in one surface layer of the hardened sheet. Preferable formation methods for this procedure are press forming, coating forming and calender forming.

Furthermore, a formed sheet of thermalconductive silicone gel having a sheet-formed reinforcement material buried in one surface layer of the hardened sheet was produced by the following method using roll forming: A silicone gel containing a thermalconductive filler was sandwiched between a resin film onto whose surface a sheet-shaped reinforcement layer has been layered and a resin film onto whose surface a sheet-shaped reinforcement layer has not been layered, and was then rolled by being passed through at least one pair of rolls.

When the rolled sheet is continually passed through a heating furnace and hardened, then the silicone gel containing a thermalconductive filler becomes a formed sheet of thermalconductive silicone gel having a sheet-shaped reinforcement material buried in a surface layer on one side of the hardened sheet.

Procedure 4

A formed sheet of thermalconductive silicone gel having a sheet-shaped reinforcement material buried in a surface layer on one side of the hardened sheet, and a thin film reinforcement layer hardened into rubber only in a surface layer of the same side was produced by combining procedures 1 and 3. Applicable formation methods for this procedure are press forming, coating forming and calender forming, but methods based on roll forming can be used as well.

Procedure 5

A formed sheet of thermalconductive silicone gel having a sheet-shaped reinforcement material buried in a surface layer on one side of the hardened sheet, and a thin film reinforcement layer hardened into rubber only in a surface layer of both sides of the sheet was produced by combining procedures 2 and 3. Applicable formation methods for this procedure are press forming, coating forming and calender forming, but methods based on roll forming can be used as well. A formed sheet of thermalconductive silicone gel according to the present invention, produced with one of the above methods, provides the following advantages:

Advantage 1

The formed sheet of thermalconductive silicone gel having a thin film reinforcement layer hardened into rubber in a surface layer on the upper side, the lower side or on both sides is not prone to extreme deformation or rupture during the mounting process, and thus is easier to handle. Not only can the orientation of the sheet be chosen at the time of its adhesion, but also the formed sheet of thermalconductive silicone gel is not sticky on both sides, because the stickiness of the surface of the thin film reinforcement layer becomes negligible when it is hardened into rubber. Thus, when the contact compression of the chip and the heat sink is released for maintenance after the mounting, the sheet is not easily stretched apart so that it deforms extremely or breaks. Furthermore, when all portions of the sheet other than the hardened thin film reinforcement layer are extremely soft, the same characteristics of flexibility and compressibility in a direction perpendicular to the sheet as in a thermalconductive silicone gel sheet having no thin film reinforcement layer can be obtained.

Advantage 2

When a sheet-shaped reinforcement material is buried in a surface layer of the upper or the lower side, the strength of the thermalconductive silicone gel sheet is increased, and the sheet is easier to handle during the mounting process and is not easily ruptured during the contact compression due to extreme unevenness of the contact compression surface of the chip or the heat sink. Furthermore, when the sheet-shaped reinforcement material is buried in a surface layer on one side, the compressibility can be suppressed to a lower value as compared to when the sheet-shaped reinforcement material is buried in a location other than a surface layer.

Advantage 3

When a sheet-shaped reinforcement material is buried in a surface layer on the upper or the lower side of the sheet, and the sheet has a thin film reinforcement layer hardened into rubber in this surface layer or in a surface layer on both sides, then the sheet can be handled even more easily than previously described under Advantage 2, because the stickiness of the thin film reinforcement layer hardened into rubber becomes negligible.

EXAMPLES

In the following, the present invention is explained in detail with reference to the drawings.

Example 1

Figure 1A:
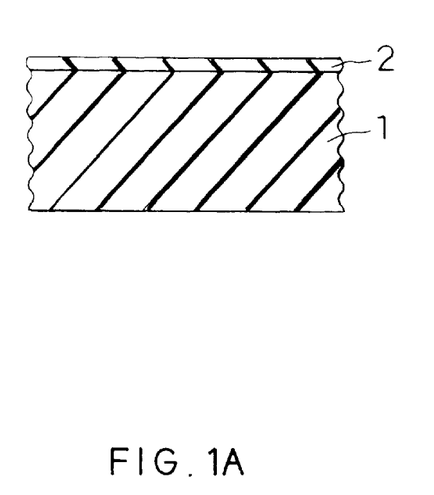
FIGS. 1A and B are a sectional views of a formed sheet of thermalconductive silicone gel according to a first example of the present invention.
Figure 1B:
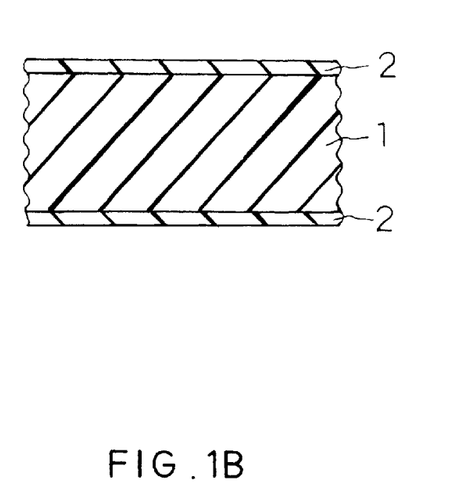

FIGS. 1A and B are sectional drawings showing a first example of a first formed sheet of thermalconductive silicone gel according to the present invention. As is shown in FIGS. 1A and B, this formed sheet of thermalconductive silicone gel is composed of a silicone gel layer 1 containing a thermalconductive filler, and a thin film reinforcement layer 2, wherein a silicone gel containing a thermalconductive filler was hardened into rubber. FIG. 1A shows an example wherein the thin film reinforcement layer 2 is formed only in a surface layer on one side of the silicone gel layer 1 containing a thermalconductive filler, whereas FIG. 1B shows an example wherein the thin film reinforcement layer 2 is formed in a surface layer on both sides of the silicone gel layer 1 containing a thermalconductive filler.

For the silicone gel layer 1 and the thin film reinforcement layer 2, a silicone gel, containing the same thermalconductive filler, hardened by an addition reaction is used. In addition, at the hardening and formation time, the silicone gel is sandwiched between a polyester (PET) film to which about 5 μm of an organohydrogen polysiloxane containing at least two hydrogen atoms bonded to a silicon atom in each molecule have been applied, and a PET film to which said organohydrogen polysiloxane has not been applied. Alternatively, the silicone gel is sandwiched between two PET films to which said organohydrogen polysiloxane has been applied. After the silicone gel is rolled by being passed through a pair of rolls, it is continually passed through a heating furnace. Thus, a thin film reinforcement layer hardened into rubber can be formed in a surface layer of one side or both sides of the sheet. The PET film is removed from the silicone gel after the hardening.

The silicone gel layer 1, containing a thermalconductive filler, and the thin film reinforcement layer 2, which has been hardened into rubber, can be produced by using one of the following silicone gels containing a thermalconductive filler hardened by an addition reaction.

(1) Silicone Gel Composition, Containing a Thermalconductive filler

Sarcon GR A/B (Hardness Asker F 57): Product of Fuji Polymer Ind., Co.

Sarcon GR-a A/B (Hardness Asker F 54): Product of Fuji Polymer Ind., Co.

SE4445CV A/B (Hardness Asker F 47): Product of Dow Corning Toray Silicone Co.

(2) Organohydrogen Polysiloxane Containing at least Two Hydrogen Atoms Bonded to a Silicon Atom in each Molecule SH-1107: Product of Dow Corning Toray Silicone, Co.

RD-1: Product of Dow Corning Toray Silicone, Co.

Using the above compositions, the silicone gel is sandwiched between two resin films. After the silicone gel is rolled by being passed through a pair of rolls, it is passed through a heating furnace with an internal furnace temperature of 280° C. and a passage velocity through the furnace of 3m/min. The characteristics of the formed sheet of thermalconductive silicone gel obtained under these conditions are shown in Table 1 and 2. The FIGS. shown in these tables refer to a sample having a 1.0 mm thick silicone gel layer 1 and a 0.03 mm thick thin film reinforcement layer 2, and to a sample with a 2.0 mm thick silicone gel layer 1 and a 0.05 mm thick thin film reinforcement layer 2. The comparative sample has, except for the differences pointed out in the remarks to the table, the same composition as the example. This is also true for all following examples.

TABLE 1

Typical product properties of Example 1, using Sarcon GR - a A/B

| | Sample A | Comp. Sample | Testing Method |
|---|---|---|---|
| Thermal Conductivity (W/m · K) | 1.5 | 1.5 | Unsteady Hot Wire Method |
| Thermal Resistance (° C./W) | | | |
| 1.0 mm | 0.78 | 0.78 | Transistor: TO-3 |
| 2.0 mm | 1.50 | 1.50 | Appl. Power: 20 W for 5 min Load: 2 kgf |

TABLE 1-continued

Typical product properties of Example 1, using Sarcon GR - a A/B

| | Sample A | | Comp. Sample | | Testing Method |
|---|---|---|---|---|---|
| Compression Load (kgf) | | | | | |
| Compression Rate | 1.0 mm | 2.0 mm | 1.0 mm | 2.0 mm | Sample Size: 25 mm × 25 mm |
| 10% | 21.5 | 11.9 | 16.2 | 8.0 | Compression. Vel.: |
| 20% | 46.5 | 20.5 | 35.9 | 15.9 | 5 mm/min |
| 30% | 72.1 | 31.5 | 49.7 | 22.9 | Load Cell: |
| 40% | 104.4 | 47.4 | 64.5 | 33.1 | 200 kgf |

Remarks:
Sample A is composed of a formed sheet of thermalconductive silicone gel with a thin film reinforcement layer formed in a surface layer of one side of the sheet. The Comparative Sample is composed of a formed sheet of thermalconductive silicone gel without the thin film reinforcement layer.

TABLE 2

Typical material properties of Example 1, using Sarcon GR - a A/B

| | Sample A | Comp. Sample | Testing Method |
|---|---|---|---|
| Color | gray-black | gray-black | — |
| Spec. Gravity | 2.4 | 2.4 | Water Displacement Method |
| Tens. Strength (kgf/cm$^2$) | 4 | 3 | JIS-K-6301 (No. 2) |
| Extensibility (%) | 270 | 340 | JIS-K-6301 (No. 2) |
| Tear. Strength (kgf/cm) | 3 | 2 | JIS-K-6301 (Type B) |
| Vol. Resistivity (Ω.cm) | $1 \times 10^{13}$ | $1 \times 10^{13}$ | JIS-C-2123 |
| Isolation Breakdown Voltage (kV/mm) | 18 | 18 | JIS-C-2123 |
| Withstand Voltage (kV/mm) | 14 | 14 | JIS-C-2123 |

Remarks: Sample A is composed of a formed sheet of thermalconductive silicone gel with a thin film reinforcement layer formed in a surface layer of one side of the sheet. The Comparative Sample is composed of a formed sheet of thermalconductive silicone gel without the thin film reinforcement layer.

As becomes clear from Tables 1 and 2, the thermal resistance of the present example (Sample A) is low, the compressibility is kept comparatively low, the tensile strength and the tearing strength are high, the extensibility is low, and the handling properties during the mounting process are good. Reuse of the formed sheet of thermalconductive silicone gel after the compression release of the chip and the heat sink was possible.

Example 2

Next, a second example of a first formed sheet of thermalconductive silicone gel according to the present invention is explained. The formed sheet of thermalconductive silicone gel of this example is shown in FIGS. 1A and B.

In the present example, for the silicone gel layer 1 and the thin film reinforcement layer 2, a silicone gel containing the same thermalconductive filler is used. In addition, at the hardening and formation time, the silicone gel is covered on one side with a polypropylene (PP) film to which about 5 μm of an organohydrogen polysiloxane containing at least two hydrogen atoms bonded to a silicon atom in each molecule have been applied, and on the other side with a PP film to which said organohydrogen polysiloxane has not been applied. Alternatively, the silicone gel is covered on both sides with PP films to which said organohydrogen polysiloxane has been applied. Thus, a thin film reinforcement layer hardened into rubber can be formed in a surface layer of one side or both sides of the sheet.

The silicone gel layer 1, containing a thermalconductive filler, and the thin film reinforcement layer 2, which has been hardened into rubber, can be produced by using one of the following addition reaction type thermalconductive silicone composition.

(1) Silicone Gel Composition, Containing a Thermalconductive filler

Sarcon GR A/B (Hardness Asker F 57): Product of Fuji Polymer Ind., Co.

Sarcon GR-a A/B (Hardness Asker F 54): Product of Fuji Polymer Ind., Co.

SE4445CV A/B (Hardness Asker F 47): Product of Dow Corning Toray Silicone Co.

(2) Organohydrogen Polysiloxane Containing at least Two Hydrogen Atoms Bonded to a Silicon Atom in each Molecule SH-1107: Product of Dow Corning Toray Silicone, Co.

RD-1: Product of Dow Corning Toray Silicone, Co.

Using the above compositions, the silicone gel is formed by the press forming method. The characteristics of a formed sheet of thermalconductive silicone gel obtained at 100° C. forming temperature, 3 min forming time, and 100 kgf/cm² forming pressure are shown in Table 3 and 4. The figures shown in these tables refer to a sample having a 1.0 mm thick silicone gel layer 1 and a 0.03 mm thick thin film reinforcement layer 2, and to a sample with a 2.0 mm thick silicone gel layer 1 and a 0.05 mm thick thin film reinforcement layer 2.

TABLE 3

Typical product properties of Example 2, using Sarcon GR - a A/B

| | Sample B | | Comp. Sample | | Testing Method |
|---|---|---|---|---|---|
| Thermal Conductivity (W/m · K) | 1.5 | | 1.5 | | Unsteady Hot Wire Method |
| Thermal Resistance (° C./W) | | | | | |
| 1.0 mm | 1.01 | | 0.78 | | Transistor: TO-3 |
| 2.0 mm | 1.52 | | 1.45 | | Appl. Power: 20 W for 5 min Load: 2 kgf |
| Compression Load (kgf) | | | | | |
| Compression Rate | 1.0 mm | 2.0 mm | 1.0 mm | 2.0 mm | Sample Size: 25 mm × 25 mm |
| 10% | 25.5 | 22.2 | 18.5 | 13.2 | Compression. Vel.: |
| 20% | 57.3 | 40.2 | 41.8 | 23.1 | 5 mm/min |
| 30% | 83.5 | 62.5 | 58.9 | 34.8 | Load Cell: |
| 40% | 115.9 | 92.3 | 80.4 | 51.6 | 200 kgf |

Remarks:
Sample B is composed of a formed sheet of thermalconductive sihcone gel with a thin film reinforcement layer formed in a surface layer of one side of the sheet. The Comparative Sample is composed of a formed sheet of thermalconductive silicone gel without the thin film reinforcement layer.

TABLE 4

Typical material properties of Example 2, using Sarcon GR - a A/B

| | Sample B | Comp. Sample | Testing Method |
|---|---|---|---|
| Color | gray-black | gray-black | — |
| Spec. Gravity | 2.4 | 2.4 | Water Displacement Method |

TABLE 4-continued

Typical material properties of Example 2, using Sarcon GR - a A/B

| | Sample B | Comp. Sample | Testing Method |
|---|---|---|---|
| Tens. Strength (kgf/cm²) | 4 | 3 | JIS-K-6301 (No. 2) |
| Extensibility (%) | 270 | 340 | JIS-K-6301 (No. 2) |
| Tear. Strength (kgf/cm) | 3 | 2 | JIS-K-6301 (Type B) |
| Vol. Resistivity (Ω.cm) | $1 \times 10^{13}$ | $1 \times 10^{13}$ | JIS-C-2123 |
| Isolation Breakdown Voltage (kV/mm) | 18 | 18 | JIS-C-2123 |
| Withstand Voltage (kV/mm) | 14 | 14 | JIS-C-2123 |

Remarks: Sample B is composed of a formed sheet of thermalconductive silicone gel with a thin film reinforcement layer formed in a surface layer of one side of the sheet. The Comparative Sample is composed of a formed sheet of thermalconductive silicone gel without the thin film reinforcement layer.

As becomes clear from Tables 3 and 4, the thermal resistance of the present example (Sample B) is low, the compressibility is low, the tensile strength and the tearing strength are high, the extensibility is low, and the handling properties during the mounting process are good. Reuse of the formed sheet of thermalconductive silicone gel after the compression release of the chip and the heat sink was possible.

Example 3

Figure 2:
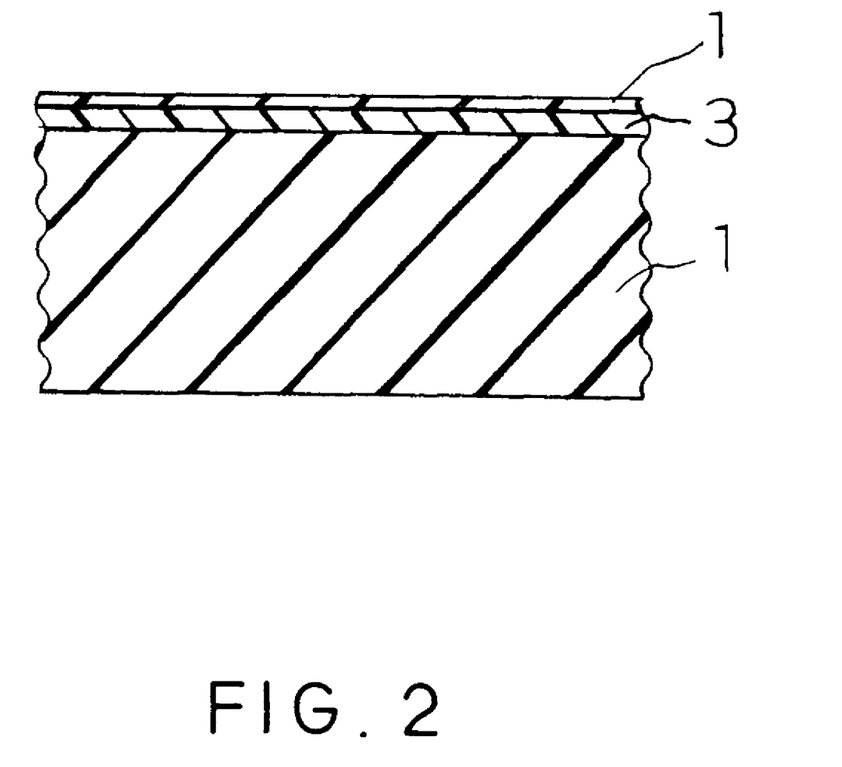
FIG. 2 is a sectional view of a formed sheet of thermalconductive silicone gel according to a second example of the present invention.

FIG. 2 is a sectional drawing showing a first example of a second formed sheet of thermalconductive silicone gel according to the present invention. As is shown in FIG. 2, this formed sheet of thermalconductive silicone gel is composed of a silicone gel layer 1 containing a thermalconductive filler, and a sheet-shaped reinforcement material 3. FIG. 2 shows an example wherein the reinforcement material 3 is buried in a surface layer on one side of the silicone gel layer 1 containing a thermalconductive filler, thereby completely covering the reinforcement material.

A mesh fabric of polyester fiber, heat-proof nylon fiber, aramid fiber, cotton fiber or the like can be used for the sheet-shaped reinforcement material 3. However, considering the thermal tolerance, polyester fiber or heat-proof nylon fiber is preferable.

The silicone gel layer 1 containing a thermalconductive filler and the sheet-shaped reinforcement material 3 can be produced by using one of the compositions below.

(1) Silicone Gel Composition, Containing a Thermalconductive filler

Sarcon GR A/B (Hardness Asker F 57): Product of Fuji Polymer Ind., Co.

Sarcon GR-a A/B (Hardness Asker F 54): Product of Fuji Polymer Ind., Co.

SE4445CV A/B (Hardness Asker F 47): Product of Dow Corning Toray Silicone Co.

(2) Sheet-Shaped Reinforcement Material (Mesh fabric of Nylon Fiber)

Nylon-ture N-5035

Using the above compositions, the silicone gel is sandwiched between resin films. After the silicone gel is rolled by being passed through a pair of rolls, it is passed through a heating furnace with an internal furnace temperature of 280° C. and a passage velocity through the furnace of 3 m/min. The characteristics of the formed sheet of thermalconductive silicone gel obtained under these conditions are shown in Table 5 and 6. The FIGS. shown in these tables refer to a sample having a 1.0 mm thick silicone gel layer 1 and a reinforcement material 3 buried to a depth of about 0.2 mm in the silicone gel layer 1, and to a sample with a 2.0 mm thick silicone gel layer 1 and a reinforcement material 3 buried to a depth of about 0.3 mm in the silicone gel layer 1. The term "depth" indicates the distance from the upper surface of the reinforcement material to the upper surface of the gel.

TABLE 5

Typical product properties of Example 3, using Sarcon GR - a A/B

|  | Sample C |  | Comp. Sample |  | Testing Method |
|---|---|---|---|---|---|
| Thermal Conductivity (W/m · K) | 1.5 |  | 1.5 |  | Unsteady Hot Wire Method |
| Thermal Resistance (° C./W) |  |  |  |  |  |
| 1.0 mm | 0.80 |  | 0.80 |  | Transistor: TO-3 |
| 2.0 mm | 1.50 |  | 1.50 |  | Appl. Power: 20 W for 5 min Load: 2 kgf |
| Compression Load (kgf) |  |  |  |  |  |
| Compression Rate | 1.0 mm | 2.0 mm | 1.0 mm | 2.0 mm | Sample Size: 25 mm × 25 mm |
| 10% | 18.4 | 12.4 | 29.6 | 22.6 | Compression. Vel.: |
| 20% | 50.2 | 30.9 | 65.7 | 48.3 | 5 mm/min |
| 30% | 78.1 | 53.6 | 107.8 | 81.1 | Load Cell: |
| 40% | 108.8 | 82.1 | 154.5 | 118.1 | 200 kgf |

Remarks:
Sample C is composed of a formed sheet of thermalconductive silicone gel with a buried sheet-shaped reinforcement material in a surface layer of one side of the sheet. The Comparative Sample is composed of a formed sheet of thermalconductive silicone gel without the thin film reinforcement layer.

TABLE 6

Typical material properties of Example 3, using Sarcon GR - a A/B

|  | Sample C | Comp. Sample | Testing Method |
|---|---|---|---|
| Color | gray-black | gray-black | — |
| Spec. Gravity | 2.4 | 2.4 | Water Displacement Method |
| Tens. Strength (kgf/cm$^2$) | 5 | 5 | JIS-K-6301 (No. 2) |
| Extensibility (%) | 100 | 100 | JIS-K-6301 (No. 2) |
| Tear. Strength (kgf/cm) | 4 | 4 | JIS-K-6301 (Type B) |
| Vol. Resistivity (Ω.cm) | 1 × 10$^{13}$ | 1 × 10$^{13}$ | JIS-C-2123 |
| Isolation Breakdown Voltage (kV/mm) | 16 | 16 | JIS-C-2123 |
| Withstand Voltage (kV/mm) | 13 | 13 | JIS-C-2123 |

Remarks: Sample C is composed of a formed sheet of thermalconductive silicone gel with a buried sheet-shaped reinforcement material in a surface layer of one side of the sheet. The Comparative Sample is composed of a formed sheet of thermalconductive silicone gel with a buried sheet-shaped reinforcement material in a center portion of the sheet.

As becomes clear from Tables 5 and 6, the thermal resistance of the present example (Sample C) is low, the compressibility is low, the tensile strength and the tearing strength are high, the extensibility is low, and the handling properties during the mounting process are good. Reuse of the formed sheet of thermalconductive silicone gel after the compression release of the chip and the heat sink was possible.

Example 4

Next, a second example of a second formed sheet of thermalconductive silicone gel according to the present invention is explained. The formed sheet of thermalconductive silicone gel of this second example is shown in FIG. 2.

A mesh fabric of polyester fiber, heat-proof nylon fiber, aramid fiber, cotton fiber or the like can be used for the sheet-shaped reinforcement material 3. However, considering the thermal tolerance, polyester fiber or heat-proof nylon fiber are preferable.

The silicone gel layer 1 containing a thermalconductive filler and the sheet-shaped reinforcement material 3 can be produced by using one the compositions below.

(1) Silicone Gel Composition, Containing a Thermalconductive filler

Sarcon GR A/B (Hardness Asker F 57): Product of Fuji Polymer Ind., Co.

Sarcon GR-a A/B (Hardness Asker F 54): Product of Fuji Polymer Ind., Co.

SE4445CV A/B (Hardness Asker F 47): Product of Dow Corning Toray Silicone Co.

(2) Sheet-Shaped Reinforcement Material (Mesh fabric of Polyester Fiber)

Russell-Net T-280

Russell-Net T-180-50D

Using the above compositions, the silicone gel is formed by the press forming method. The characteristics of a formed sheet of thermalconductive silicone gel obtained at 100° C. forming temperature, 3 min forming time, and 100 kgf/cm$^2$ forming pressure are shown in Table 7 and 8. The figures shown in these tables refer to a sample having a 1.0 mm thick silicone gel layer 1 and a reinforcement layer 3 with a weight per area of 55 g/m$^2$ (Russell-Net T-280) buried to a depth of about 0.2 mm in the silicone gel layer 1, and to a sample with a 2.0 mm thick silicone gel layer 1 and a reinforcement layer 3 with a weight per area of 55 g/m$^2$ (Russell-Net T-280) buried to a depth of about 0.3 mm in the silicone gel layer 1.

TABLE 7

Typical product properties of Example 4, using Sarcon GR - a A/B

|  | Sample D |  | Comp. Sample |  | Testing Method |
|---|---|---|---|---|---|
| Thermal Conductivity (W/m · K) | 1.5 |  | 1.5 |  | Unsteady Hot Wire Method |
| Thermal Resistance (° C./W) |  |  |  |  |  |
| 1.0 mm | 1.03 |  | 0.78 |  | Transistor: TO-3 |
| 2.0 mm | 1.72 |  | 1.45 |  | Appl. Power: 20 W for 5 min Load: 2 kgf |
| Compression Load (kgf) |  |  |  |  |  |
| Compression Rate | 1.0 mm | 2.0 mm | 1.0 mm | 2.0 mm | Sample Size: 25 mm × 25 mm |
| 10% | 22.4 | 20.6 | 55.5 | 39.6 | Compression. Vel.: |
| 20% | 63.0 | 50.7 | 125.4 | 69.3 | 5 mm/min |
| 30% | 108.7 | 88.2 | 176.7 | 104.4 | Load Cell: |
| 40% | 157.5 | 129.9 | >200 | 154.8 | 200 kgf |

Remarks:
Sample D is composed of a formed sheet of thermalconductive silicone gel with a buried sheet-shaped reinforcement material in a surface layer of one side of the sheet. The Comparative Sample is composed of a formed sheet of thermalconductive sihcone gel with a buried sheet-shaped reinforcement material in a center portion of the sheet.

TABLE 8

Typical material properties of Example 4, using Sarcon GR - a A/B

|  | Sample D | Comp. Sample | Testing Method |
|---|---|---|---|
| Color | gray-black | gray-black | — |
| Spec. Gravity | 2.3 | 2.3 | Water Displacement Method |
| Tens. Strength (kgf/cm$^2$) | 18 | 18 | JIS-K-6301 (No. 2) |
| Extensibility (%) | 180 | 180 | JIS-K-6301 (No. 2) |
| Tear. Strength (kgf/cm) | 7 | 7 | JIS-K-6301 (Type B) |
| Vol. Resistivity (Ω.cm) | $1 \times 10^{13}$ | $1 \times 10^{13}$ | JIS-C-2123 |
| Isolation Breakdown Voltage (kV/mm) | 18 | 18 | JIS-C-2123 |
| Withstand Voltage (kV/mm) | 14 | 14 | JIS-C-2123 |

Remarks: Sample D is composed of a formed sheet of thermalconductive silicone gel with a buried sheet-shaped reinforcement material in a surface layer of one side of the sheet. The Comparative Sample is composed of a formed sheet of thermalconductive silicone gel with a buried sheet-shaped reinforcement material in a center portion of the sheet.

As becomes clear from Tables 7 and 8, the thermal resistance of the present example (Sample D) is low, the compressibility is low, the tensile strength and the tearing strength are high, the extensibility is low, and the handling properties during the mounting process are good. Reuse of the formed sheet of thermalconductive silicone gel after the compression release of the chip and the heat sink was possible.

Example 5

Figure 3A:
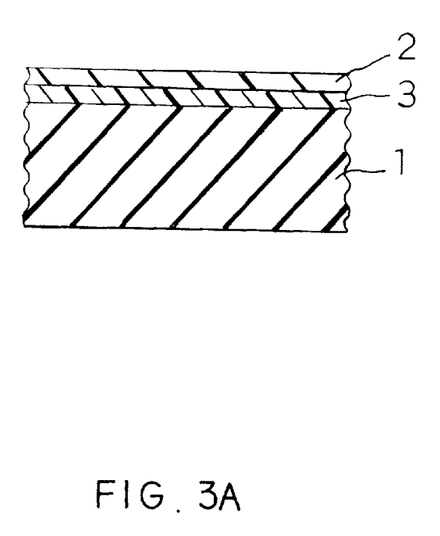
FIGS. 3A and B are sectional views of a formed sheet of thermalconductive silicone gel according to a third example of the present invention.
Figure 3B:
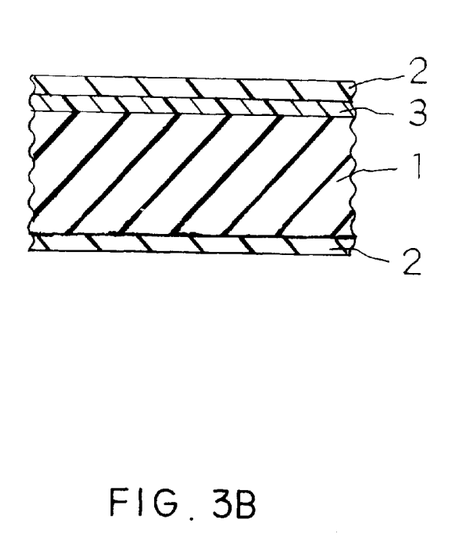

FIGS. 3A and B are sectional drawings showing a first example of a third formed sheet of thermalconductive silicone gel according to the present invention. As is shown in FIGS. 3A and B, this formed sheet of thermalconductive silicone gel is composed of a silicone gel layer 1 containing a thermalconductive filler, a thin film reinforcement layer 2 wherein the silicone gel containing a thermalconductive filler has been hardened into rubber, and a sheet-shaped reinforcement material 3. FIG. 3 A shows an example wherein the sheet-shaped reinforcement material 3 is formed in a surface layer on one side of the silicone gel layer 1 containing a thermalconductive filler, and a thin film reinforcement layer 2, wherein the silicone gel containing a thermalconductive filler has been hardened into rubber, is formed on this surface layer. FIG. 3B shows an example wherein the sheet-shaped reinforcement material 3 is formed in a surface layer on one side of the silicone gel layer 1 containing a thermalconductive filler, and a thin film reinforcement layer 2, wherein the silicone gel containing a thermalconductive filler has been hardened into rubber, is formed on both surface layers.

For the silicone gel layer 1 containing a thermalconductive filler and the thin film reinforcement layer 2, a silicone gel hardened by an addition reaction, which silicone gel contains the same thermalconductive filler, is used. In addition, at the hardening and formation time, the silicone gel is sandwiched between a PET film to which about 5 μm of an organohydrogen polysiloxane containing at least two hydrogen atoms bonded to a silicon atom in each molecule have been applied, and a PET film to which said organohydrogen polysiloxane has not been applied. Alternatively, the silicone gel is sandwiched between two PET films to which said organohydrogen polysiloxane has been applied. After the silicone gel is rolled by being passed through a pair of rolls, it is continually passed through a heating furnace. Thus, a thin film reinforcement layer hardened into rubber can be formed in a surface layer of one side or both sides of the sheet.

A mesh fabric of polyester fiber, heat-proof nylon fiber, aramid fiber, cotton fiber or the like can be used for the sheet-shaped reinforcement material 3. However, considering the thermal tolerance, polyester fiber or heat-proof nylon fiber are preferable.

The same compositions as listed under Example 1 and Example 3 can be used to produce the silicone gel layer 1 containing a thermalconductive filler, the thin film reinforcement layer 2 hardened into rubber, and the sheet-shaped reinforcement material 3.

Using the above compositions, the silicone gel is sandwiched between resin films. After the silicone gel is rolled by being passed through a pair of rolls, it is passed through a heating furnace with an internal furnace temperature of 280° C. and a passage velocity through the furnace of 3 m/min. The characteristics of the formed sheet of thermalconductive silicone gel obtained under these conditions are shown in Table 9 and 10. The figures shown in these tables refer to a sample having a 1.0 mm thick silicone gel layer 1, a 0.03 mm thick thin film reinforcement layer 2 and a reinforcement material 3 buried to a depth of about 0.2 mm in the silicone gel layer 1, and to a sample with a 2.0 mm thick silicone gel layer 1, a 0.05 mm thick thin film reinforcement layer 2 and a reinforcement material 3 buried to a depth of about 0.3 mm in the silicone gel layer 1.

TABLE 9

Typical product properties of Example 5, using Sarcon GR - a A/B

|  | Sample E | | Comp. Sample | | Testing Method |
|---|---|---|---|---|---|
| Thermal Conductivity (W/m · K) | 1.5 | | 1.5 | | Unsteady Hot Wire Method |
| Thermal Resistance (° C./W) | | | | | |
| 1.0 mm | 0.82 | | 0.82 | | Transistor: TO-3 |
| 2.0 mm | 1.52 | | 1.52 | | Appl. Power: 20 W for 5 min Load: 2 kgf |
| Compression Load (kgf) | | | | | |
| Compression Rate | 1.0 mm | 2.0 mm | 1.0 mm | 2.0 mm | Sample Size: 25 mm × 25 mm |
| 10% | 23.8 | 16.2 | 29.6 | 22.6 | Compression. Vel.: |
| 20% | 57.3 | 34.2 | 65.7 | 48.3 | 5 mm/min |
| 30% | 89.3 | 56.1 | 107.8 | 81.1 | Load Cell: |
| 40% | 124.7 | 82.6 | 154.5 | 118.1 | 200 kgf |

Remarks:
Sample E is composed of a formed sheet of thermalconductive silicone gel with a buried sheet-shaped reinforcement material in a surface layer of one side of the sheet and a thin film reinforcement layer on the same side of the sheet. The Comparative Sample is composed of a formed sheet of thermalconductive silicone gel with a buried sheet-shaped reinforcement material in a center portion of the sheet.

TABLE 10

Typical material properties of Example 5, using Sarcon GR - a A/B

|  | Sample E | Comp. Sample | Testing Method |
|---|---|---|---|
| Color | gray-black | gray-black | — |
| Spec. Gravity | 2.4 | 2.4 | Water Displacement Method |
| Tens. Strength (kgf/cm$^2$) | 5 | 5 | JIS-K-6301 (No. 2) |
| Extensibility (%) | 80 | 80 | JIS-K-6301 (No. 2) |
| Tear. Strength (kgf/cm) | 4 | 4 | JIS-K-6301 (Type B) |

TABLE 10-continued

Typical material properties of Example 5, using Sarcon GR - a A/B

|  | Sample E | Comp. Sample | Testing Method |
|---|---|---|---|
| Vol. Resistivity (Ω.cm) | $1 \times 10^{13}$ | $1 \times 10^{13}$ | JIS-C-2123 |
| Isolation Breakdown Voltage (kV/mm) | 16 | 16 | JIS-C-2123 |
| Withstand Voltage (kV/mm) | 13 | 13 | JIS-C-2123 |

Remarks: Sample E is composed of a formed sheet of thermalconductive silicone gel with a buried sheet-shaped reinforcement material in a surface layer of one side of the sheet and a thin film reinforcement layer on the same side of the sheet. The Comparative Sample is composed of a formed sheet of thermalconductive silicone gel with a buried sheet-shaped reinforcement material in a center portion of the sheet.
As becomes clear from Tables 9 and 10, the thermal resistance of the present example (Sample E) is low, the compressibility is kept comparatively low, the tensile strength and the tearing strength are high, the extensibility is low, and the handling properties during the mounting process are good. Reuse of the formed sheet of thermalconductive silicone gel after the compression release of the chip and the heat sink was possible.

Example 6

Next, a second example of a third formed sheet of thermalconductive silicone gel according to the present invention is explained. The formed sheet of thermalconductive silicone gel of this example is shown in FIGS. 3A and B.

In the present example, for the silicone gel layer 1 and the thin film reinforcement layer 2, a silicone gel containing the same thermalconductive filler is used. In addition, at the hardening and formation time, the silicone gel is covered on one side with a PP film to which about 5 μm of an organohydrogen polysiloxane containing at least two hydrogen atoms bonded to a silicon atom in each molecule have been applied, and on the other side with a PP film to which said organohydrogen polysiloxane has not been applied. Alternatively, the silicone gel is covered on both sides with PP films to which said organohydrogen polysiloxane has been applied. Thus, a thin film reinforcement layer hardened into rubber can be formed in a surface layer of one side or both sides of the sheet.

A mesh fabric of polyester fiber, heat-proof nylon fiber, aramid fiber, cotton fiber or the like can be used for the sheet-shaped reinforcement material 3. However, considering the thermal tolerance, polyester fiber or heat-proof nylon fiber are preferable.

The same compositions as listed under Example 1 and Example 3 can be used to produce the silicone gel layer 1 containing a thermalconductive filler, the thin film reinforcement layer 2 hardened into rubber, and the sheet-shaped reinforcement material 3.

Using the above compositions, the silicone gel is formed by the press forming method. The characteristics of a formed sheet of thermalconductive silicone gel obtained at 100° C. forming temperature, 3 min forming time, and 100 kgf/cm² forming pressure are shown in Table 11 and 12. The figures shown in these tables refer to a sample having a 1.0 mm thick silicone gel layer 1, a 0.03 mm thick thin film reinforcement layer 2 and a reinforcement layer 3 with a weight per area of 55 g/m² (Russell-Net T-280), and to a sample with a 2.0 mm thick silicone gel layer 1, a 0.05 mm thick thin film reinforcement layer 2 and a reinforcement layer 3 with a weight per area of 55 g/m² (Russell-Net T-280) buried to a depth of about 0.3 mm in the silicone gel layer 1.

TABLE 11

Typical product properties of Example 6, using Sarcon GR - a A/B

|  | Sample F | Comp. Sample | Testing Method |
|---|---|---|---|
| Thermal Conductivity (W/m · K) | 1.5 | 1.5 | Unsteady Hot Wire Method |
| Thermal Resistance (° C./W) |  |  |  |
| 1.0 mm | 1.12 | 1.12 | Transistor: TO-3 |
| 2.0 mm | 1.71 | 1.71 | Appl. Power: 20 W for 5 min Load: 2 kgf |
| Compression Load (kgf) |  |  |  |
| Compression Rate | 1.0 mm  2.0 mm | 1.0 mm  2.0 mm | Sample Size: 25 mm × 25 mm |
| 10% | 25.1    25.4 | 55.5    39.6 | Compression. Vel.: |
| 20% | 65.4    56.8 | 125.4   69.3 | 5 mm/min |
| 30% | 112.2   90.2 | 176.7   104.4 | Load Cell: |
| 40% | 161.0   134.8 | >200    154.8 | 200 kgf |

Remarks:
Sample F is composed of a formed sheet of thermalconductive silicone gel with a buried sheet-shaped reinforcement material in a surface layer of one side of the sheet and a thin film reinforcement layer on the same side of the sheet. The Comparative Sample is composed of a formed sheet of thermalconductive silicone gel with a buried sheet-shaped reinforcement material in a center portion of the sheet.

TABLE 12

Typical material properties of Example 6, using Sarcon GR - a A/B

|  | Sample F | Comp. Sample | Testing Method |
|---|---|---|---|
| Color | gray-black | gray-black | — |
| Spec. Gravity | 2.3 | 2.3 | Water Displacement Method |
| Tens. Strength (kgf/cm²) | 18 | 18 | JIS-K-6301 (No. 2) |
| Extensibility (%) | 180 | 180 | JIS-K-6301 (No. 2) |
| Tear. Strength (kgf/cm) | 7 | 7 | JIS-K-6301 (Type B) |
| Vol. Resistivity (Ω.cm) | $1 \times 10^{13}$ | $1 \times 10^{13}$ | JIS-C-2123 |
| Isolation Breakdown Voltage (kV/mm) | 18 | 18 | JIS-C-2123 |
| Withstand Voltage (kV/mm) | 14 | 14 | JIS-C-2123 |

Remarks: Sample F is composed of a formed sheet of thermalconductive silicone gel with a buried sheet-shaped reinforcement material in a surface layer of one side of the sheet and a thin film reinforcement layer on the same side of the sheet. The Comparative Sample is composed of a formed sheet of thermalconductive silicone gel with a buried sheet-shaped reinforcement material in a center portion of the sheet.

As becomes clear from Tables 11 and 12, the thermal resistance of the present example (Sample F) is low, the compressibility is kept comparatively low, the tensile strength and the tearing strength are high, the extensibility is low, and the handling properties during the mounting process are good. Reuse of the formed sheet of thermalconductive silicone gel after the compression release of the chip and the heat sink was possible.

As has been explained above, in a formed sheet of thermalconductive silicone gel according to the present invention, extreme deformation or rupture during the mounting process can be prevented by providing said sheet with (i) a thin film reinforcement layer hardened into rubber only in a surface layer on the upper side, the lower side, or both sides, (ii) a sheet-shaped reinforcement material buried in a surface layer of the upper or the lower side, or (iii) a sheet-shaped reinforcement material buried in a surface layer of the upper side or the lower side of the sheet, and a thin film reinforcement layer hardened into rubber in this surface layer or in a surface layer on both sides of the sheet.

Consequently, the handling characteristics are improved, and the stickiness of the surface with the thin film reinforcement layer hardened into rubber becomes negligible. Furthermore, the orientation of the sheet can be chosen at the time of its adhesion. In addition, the formed sheet of thermalconductive silicone gel is not sticky on both sides. Thus, the sheet cannot easily be stretched apart so that it deforms extremely or breaks when the contact compression of the chip and the heat sink is released for maintenance after the mounting. Therefore, the assembly workablility of the chip and the heat sink are improved, because reuse of the sheet becomes possible. Furthermore, when a sheet-shaped reinforcement material is buried in a surface layer on one side of the sheet, the sheet is not easily ruptured during the contact compression due to extreme unevenness of the contact compression surface of the chip or the heat sink. Thus, a stable broad heat transfer surface can be ensured, and the reliability of the heat transfer can be improved. Finally, by ensuring sufficient flexibility in a direction perpendicular to the sheet, it is possible to hold down the compressibility, and thus deformation or damage due to the contact compression with electronic parts used in mounting such as chips, heat sinks and boards can be prevented, and the reliability of the electronic part or unit can be improved.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A formed sheet of thermoconductive silicone gel, wherein a thin film reinforcement layer of the thermoconductive gel is hardened into rubber in a surface layer on at least one side of the sheet;

wherein the thin film reinforcement layer is formed by forming a silicone gel containing a thermoconductive filler on an unhardened resin film;

forming a resin film having a surface to which an organohydrogen polysiloxane containing at least two hydrogen atoms bonded to a silicon atom in each molecule has been applied on top of the silicone gel; and hardening it, so that a surface layer portion of the silicone gel that contacts the organohydrogen polysiloxane containing surface is hardened into rubber.

2. The formed sheet of thermoconductive silicone gel according to claim 1, wherein a sheet-shaped reinforcement material is buried in a surface layer on one side of the sheet.

3. The formed sheet of thermoconductive silicone gel according to claim 2, wherein a sheet-shaped reinforcement layer has been layered on the surface to which the organohydrogen polysiloxane has been applied, and a layer of organohydrogen polysiloxane has optionally been applied to the unhardened resin film, wherein the sheet is rolled by being continually passed through at least one pair of rolls, and is hardened by being continually passed through a heating furnace.

4. The formed sheet of thermoconductive silicone gel according to claim 2, wherein the hardness of the thin film reinforcement layer is in the range of 10–95 when measured with an ASKER F hardness meter.

5. The formed sheet of thermoconductive silicone gel according to claim 2, wherein the thickness of the thin film reinforcement layer is in the range of 0.01–0.5 mm.

6. The formed sheet of thermoconductive silicone gel according to claim 2, wherein the depth to which the sheet-shaped reinforcement material is buried in a surface layer on one side of the sheet is in the range of more than 0 mm but not more than 1 mm.

7. The formed sheet of thermoconductive silicone gel according to claim 2, wherein the sheet-shaped reinforcement material buried in a surface layer on one side of the sheet has a mesh fabric structure using at least one fiber selected from synthetic fiber and natural fiber.

8. The formed sheet of thermoconductive silicone gel according to claim 1, wherein the hardness of the thin film reinforcement layer is in the range of 10–95 when measured with an ASKER F hardness meter.

9. The formed sheet of thermoconductive silicone gel according to claim 1, wherein the thickness of the thin film reinforcement layer is in the range of 0.01–0.5 mm.

10. The formed sheet of thermoconductive silicone gel according to claim 1, wherein a silicone gel containing a thermalconductive filler is sandwiched between (a) a resin film to which an organohydrogen polysiloxane containing at least two hydrogen atoms bonded to a silicon atom in each molecule has been applied and (b) a resin film to which said organohydrogen polysiloxane has not been applied, or sandwiched between two resin films to which said organohydrogen polysiloxane has been applied, rolled by being continually passed through at least one pair of rolls, and hardened by being continually passed through a heating furnace, whereby a thin film reinforcement layer hardened into rubber on at least one side of the sheet is formed.

* * * * *